United States Patent
Fiske et al.

(10) Patent No.: US 8,181,468 B2
(45) Date of Patent: May 22, 2012

(54) APPARATUS AND METHOD FOR DISPENSING DISCRETE AMOUNTS OF VISCOUS MATERIAL

(75) Inventors: Erik Fiske, Carlsbad, CA (US); Horatio Quinones, Carlsbad, CA (US); Philip P. Maiorca, Poway, CA (US); Alec Babiarz, Encinitas, CA (US); Robert Ciardella, Rancho Santa Fe, CA (US)

(73) Assignee: Nordson Corporation, Westlake, OH (US)

( * ) Notice: Subject to any disclaimer, the term of this patent is extended or adjusted under 35 U.S.C. 154(b) by 40 days.

(21) Appl. No.: 12/817,546

(22) Filed: Jun. 17, 2010

(65) Prior Publication Data

US 2010/0252576 A1 Oct. 7, 2010

Related U.S. Application Data

(63) Continuation of application No. 11/328,378, filed on Jan. 9, 2006, now Pat. No. 7,762,088, which is a continuation of application No. PCT/US2004/020247, filed on Jun. 25, 2004.

(60) Provisional application No. 60/487,034, filed on Jul. 14, 2003.

(51) Int. Cl.
*F25B 21/02* (2006.01)

(52) U.S. Cl. .......................................... 62/3.4; 62/3.64

(58) Field of Classification Search ................. 62/3.4, 62/3.62, 3.64, 389; 222/146.2, 146.6; 239/135, 239/412, 417.3, 600
See application file for complete search history.

(56) References Cited

U.S. PATENT DOCUMENTS

| 3,005,338 | A * | 10/1961 | Libby et al. ............... 73/147 |
| 4,979,641 | A * | 12/1990 | Turner ...................... 222/25 |
| 6,253,957 | B1 * | 7/2001 | Messerly et al. ............ 222/1 |
| 2002/0112821 | A1 | 8/2002 | Inaba et al. |

FOREIGN PATENT DOCUMENTS

| JP | 03296461 A | 12/1991 |
| JP | 09073977 A | 3/1997 |

* cited by examiner

*Primary Examiner* — Mohammad Ali
(74) *Attorney, Agent, or Firm* — Wood, Herron & Evans, LLP

(57) ABSTRACT

Apparatus and methods for dispensing small amounts of a viscous material onto a workpiece. The narrow-profile dispensing apparatus includes a fluid chamber, a nozzle, and a valve seat disk representing individual components that are removable from a main body of the dispensing apparatus for cleaning and/or replacement. The nozzle is coupled with the fluid chamber by a heat transfer body that may be cooled by, for example, a cooling fluid routed through an air pathway defined in the heat transfer body. The main body of the dispensing apparatus may be cooled by air exhausted from an air cavity of a pneumatic actuator regulating the movement of a needle to control the flow of viscous material in the dispensing apparatus.

11 Claims, 6 Drawing Sheets

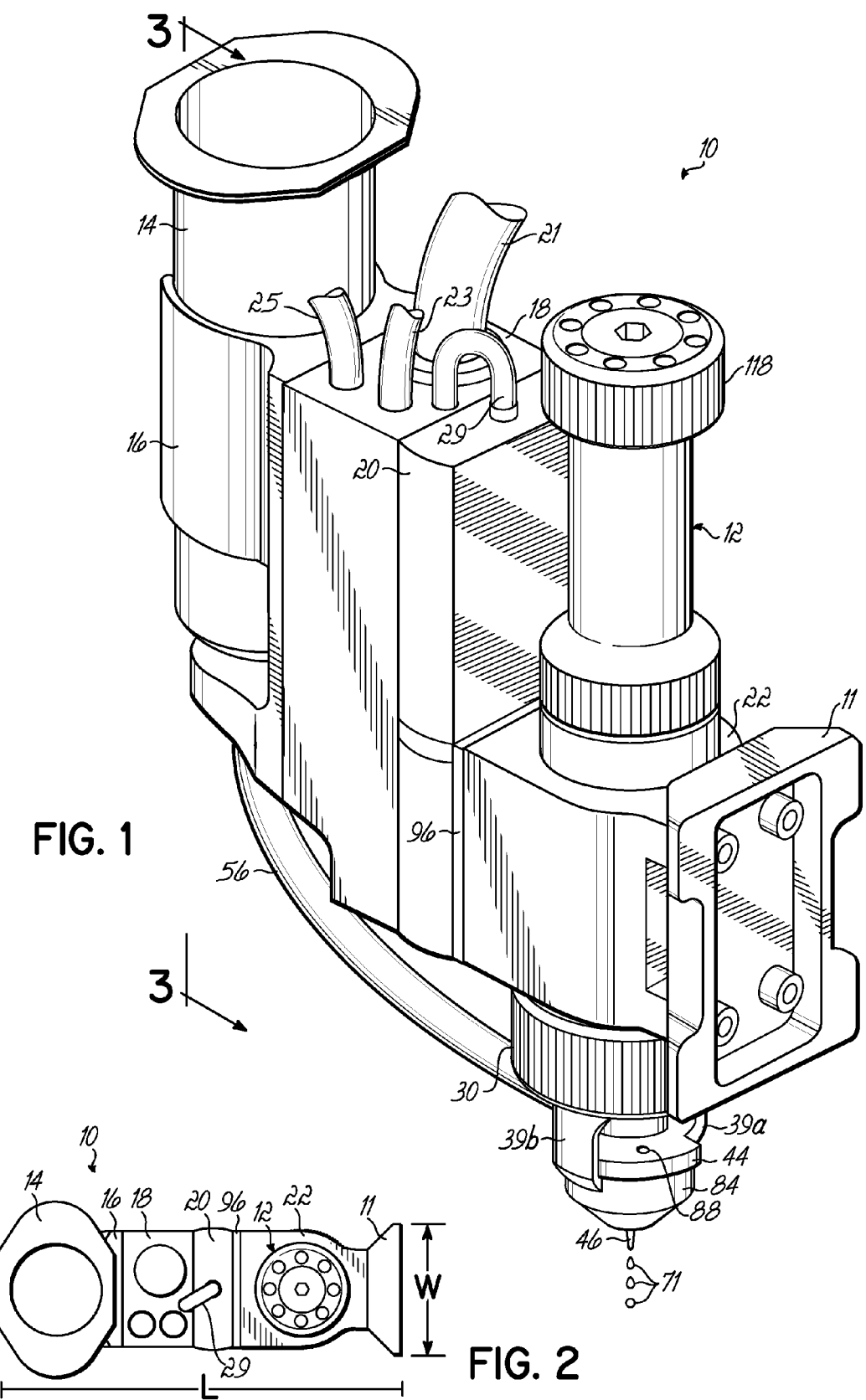

APPARATUS AND METHOD FOR DISPENSING DISCRETE AMOUNTS OF VISCOUS MATERIAL

CROSS-REFERENCE TO RELATED APPLICATIONS

This application is a continuation of application Ser. No. 11/328,378, filed Jan. 9, 2006, which is a continuation of Serial No. PCT/US2004/020247 filed Jun. 25, 2004, which claims the benefit of U.S. Provisional Application No. 60/487,034, filed on Jul. 14, 2003. The disclosure of each application is hereby incorporated by reference herein in its entirety.

FIELD OF THE INVENTION

The present invention generally relates to dispensing apparatus and methods and, in particular, to apparatus and methods for dispensing discrete amounts of viscous materials in a non-contact manner onto a workpiece.

BACKGROUND OF THE INVENTION

In the manufacture of microelectronic hardware and other products, pneumatic dispensing apparatus are used to dispense small amounts or droplets of a highly viscous material in a non-contact manner onto a substrate or workpiece. Exemplary highly viscous materials include, but are not limited to, solder flux, solder paste, adhesives, solder mask, thermal compounds, oil, encapsulants, potting compounds, inks, and silicones. Generally, such highly viscous materials cannot easily flow under their own weight at room temperature.

Conventional pneumatic non-contact dispensing apparatus for viscous materials include an air-operated valve element reciprocated for selectively engaging a valve seat surrounding a discharge passageway. In a process commonly referred to as jetting, droplets are dispensed by retracting the needle from contact with the valve seat, which allows an amount of the viscous material to flow under pressure from a filled fluid chamber through a gap separating the needle from the valve seat and into the discharge passageway. The needle is then moved rapidly toward the valve seat to close the dispensing apparatus, which causes the amount of viscous material to be forced through the discharge passageway and a comparable amount of the viscous material to be ejected from a discharge orifice of the discharge passageway. The small amount of ejected viscous material is propelled as a droplet toward a workpiece, which is spaced from the discharge outlet.

Valve seat replacement and cleaning in conventional non-contact dispensing apparatus is a time consuming and painstaking process as the internal surfaces of the dispensing apparatus are difficult to access with cleaning tools. Generally, the valve seat is integral with the fluid chamber and, as a result, is non-removable, which restricts access to the fluid chamber and creates a circular right angle corner at their juncture that is difficult to clean. In addition, the valve seat may include guide fingers or vanes that guide the needle so that a needle tip makes a reproducible fluid seal with the valve seat tolerant of minor misalignments. However, the guide vanes define right angle corners that are difficult to adequately clean effectively in a short time.

Disassembling and reassembling conventional non-contact dispensing apparatus is a difficult process that involves numerous tools. In addition, gauges are required to establish accurate spatial relationships between components during reassembly. As a result of the complexity, disassembly and reassembly are slowed and may take as long as forty-five (45) minutes to complete, even for technicians skilled in the assembly procedure.

In certain conventional dispensing apparatus, the valve seat in the fluid chamber and the tip of the needle constitute a matched pair carefully lapped to have corresponding dimensional attributes. Any attempt to replace the valve seat to, for example, change the diameter of the discharge passageway often results in leakage because the needle tip and the new valve seat are not a matched pair and, therefore, cannot provide an adequate seal. In such conventional dispensing apparatus, therefore, the diameter of the dispensing orifice may be changed only by replacing the existing needle and valve seat with a needle having a needle tip matched during manufacture with the valve seat.

Another problem encountered in conventional pneumatic non-contact dispensing apparatus is noise. The dispensing apparatus is opened and closed by switching a solenoid valve to provide and remove pressurized air from an air piston cavity. The pressurized air acts on an air piston that reciprocates the needle. To close the dispensing apparatus, the solenoid valve is switched to exhaust air pressure from the air piston cavity to the ambient environment through an exhaust passageway. The rapid flow of air through the exhaust passageway causes sound audible to bystanders. A conventional silencer or muffler may be used to reduce noise at valve exhaust ports. However, the exhaust port of the solenoid valve must be accessible to permit attachment, typically by a threaded connection, of the muffler.

It would be desirable, therefore, to provide a dispensing apparatus that overcomes these and other deficiencies of conventional dispensing apparatus for viscous materials, as described herein.

SUMMARY

In an embodiment of the invention, an apparatus includes a main body including a discharge outlet, an air cavity, and a valve element movable by selective application of pressurized air to the air cavity between an opened position in which a flow of a viscous material is directed to the discharge outlet for dispensing and a closed position in which the flow of the viscous material to the discharge outlet is blocked. The apparatus further includes a solenoid valve having an exhaust port selectively coupled in fluid communication with the air cavity at least when the valve element is moving from the opened condition to the closed position. Extending through the main body is an air passageway coupled by the exhaust port of the solenoid valve with the air cavity of the main body. Pressurized air exhausted from the air cavity flows through the air passageway to cool the main body.

In another embodiment of the invention, an apparatus includes a coolant gas source, a dispensing body including a discharge passageway receiving a flow of a viscous material, and a heat transfer member thermally coupled with the dispensing body. A temperature sensor is thermally coupled with the heat transfer member. A controller is electrically coupled with the temperature sensor and with a cooling means for cooling the heat transfer member. The controller causes the cooling means to cool the heat transfer member and the dispensing body in response to temperature signals received from the temperature sensor.

In yet another embodiment of the invention, a valve seat disk for a dispensing apparatus includes a body having a passageway, an inlet to the passageway positioned to receive a flow of a viscous material from the dispensing apparatus, and a valve seat surrounding the passageway. The valve seat is capable of being contacted by the valve element to block the flow of the viscous material into the passageway. The inlet is spaced from the passageway such that the valve element does not contact the inlet.

In yet another embodiment of the invention, an apparatus for dispensing a viscous material includes a main body, a fluid chamber housing removably attached to the main body, and a nozzle removably attachable to the fluid chamber housing. The nozzle includes a discharge passageway selectively coupled in fluid communication with a fluid chamber defined by the fluid chamber housing when the nozzle is attached to the fluid chamber housing. Removably positioned inside the fluid chamber housing is a liner covering an inner wall of the fluid chamber housing so that the inner wall is not contacted by the viscous liquid.

In yet another embodiment of the invention, a nozzle assembly for a dispensing apparatus includes a nozzle and a valve seat disk having a discharge passageway coupled with a discharge passageway of the nozzle. The valve seat disk includes a valve seat positioned to be contacted by a valve element of the dispensing apparatus to block a flow of a viscous material. The nozzle assembly further includes a fluid chamber housing containing the viscous material for flow into the discharge passageway of the valve seat disk when the valve element is open and a retainer removably mounted to the dispensing apparatus. The retainer secures the valve seat disk, the fluid chamber housing, and the nozzle to the dispensing apparatus with the valve seat disk positioned between the nozzle and the fluid chamber.

In yet another embodiment of the invention, a nozzle assembly includes a dispensing body with a discharge passageway positioned to receive a flow of a viscous material from a dispensing apparatus. The discharge passageway has a discharge outlet from which the viscous material is discharged. The nozzle assembly further includes a heat transfer body removably attaching the dispensing body to the dispensing apparatus. The heat transfer body has a fluid passageway adapted to receive a flow of the coolant gas and positioned such that the flow of the coolant gas exiting the fluid passageway does not impinge the viscous material discharged from the discharge passageway.

In yet another embodiment of the invention, a nozzle assembly includes a dispensing body having a discharge passageway, and a valve seat disk having a discharge passageway coupled with the discharge passageway of the dispensing body, and a valve seat. The valve seat is positioned to be contacted by a valve element of a dispensing apparatus to block the flow of viscous material to the discharge passageway of the valve seat disk. The nozzle assembly further includes a heat transfer body removably securing the dispensing body and the valve seat with the dispensing apparatus such that the valve seat disk is positioned between the dispensing body and the valve element.

In yet another embodiment of the invention, a method of dispensing a viscous material includes directing the viscous material through a discharge passageway in a nozzle, sensing a temperature of the nozzle with a temperature sensor inside the nozzle, and comparing the sensed temperature of the nozzle with a set point temperature. If the temperature of the nozzle is greater than the set point temperature, the nozzle is actively cooled.

In yet another embodiment of the invention, a method of dispensing a viscous material includes exhausting pressurized air from a pneumatic actuator to discontinue a flow of the viscous material discharged from a dispensing apparatus. The method further includes cooling a portion of the dispensing apparatus by directing the exhausted air through an air passageway defined in the dispensing apparatus.

These and other objects and advantages of the present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

FIG. 1 is a perspective view of a dispensing apparatus in accordance with an embodiment of the invention;

FIG. 2 is a top view of the dispensing apparatus of FIG. 1 shown with the electrical cable and pneumatic conduits absent for clarity;

DETAILED DESCRIPTION

Figure 3:
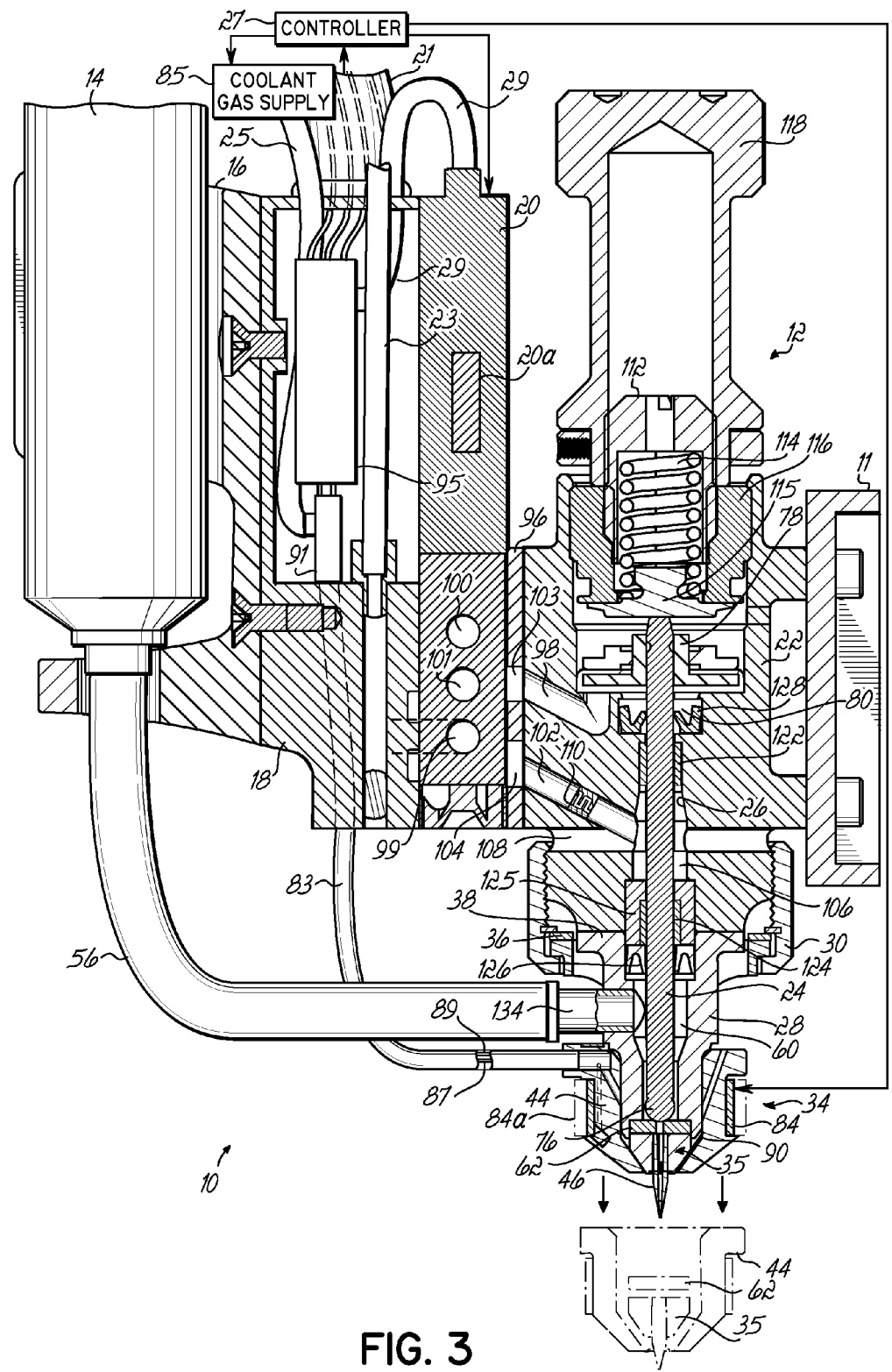
FIG. 3 is a cross-sectional view of the dispensing apparatus taken generally along line 3-3 in FIG. 1.

With reference to FIGS. 1 and 2, a dispensing apparatus 10 for use with a computer-controlled non-contact dispensing system (not shown) is shown. The dispensing apparatus 10 of the invention may be installed in dispensing systems including those similar, or identical to, the dispensing systems described in U.S. Pat. No. 5,747,102 entitled "Method and Apparatus for Dispensing Small Amounts of Liquid Material", the disclosure of which is incorporated herein by reference in its entirety. Dispensing apparatus 10 is particularly useful when installed in the Asymtek X-1010 Axiom™ SMT Dispenser, the Asymtek X-1020 Axiom™ Semiconductor Dispenser, the Asymtek M-2020 Millennium® Ultra High Speed Semiconductor Dispenser, or the Asymtek M-2010 Millennium® Ultra High Speed SMT Dispenser. The dispensing apparatus 10 includes a mount 11, illustrated in FIGS. 1 and 2 as a dovetail mount, for attaching dispensing apparatus 10 to a mechanical support of the dispensing system.

The dispensing apparatus 10 includes a module, generally indicated by reference numeral 12, partially positioned inside of a main body 22 and partially projecting from opposite ends of main body 22, a syringe holder 16 supporting a supply device 14, a solenoid valve 20, and a junction box 18 positioned between the syringe holder 16 and the solenoid valve 20. An electrical cable 21 and fluid conduits 23, 25 servicing the dispensing apparatus 10 are interfaced to apparatus 10 at the junction box 18, which acts as a centralized distribution point for power and fluid to module 12 and solenoid valve 20. The opposite end of the electrical cable 21 is coupled with a controller 27 (FIG. 3) of the dispensing system that controls the operation of the dispensing apparatus 10. Fluid conduit 23 supplies pressurized air to a fluid manifold inside the junction box 18 coupled to solenoid valve 20, which is energized and de-energized by electrical signals supplied from controller 27 over electrical cables 21 and 29 to supply pressurized air for opening and closing the pneumatically-operated dispensing apparatus 10.

Generally, the controller 27 may comprise any electrical control apparatus configured to control one or more variables based upon one or more inputs. A number of individual control systems may be used to control various components (e.g., solenoid valve 20, coolant gas supply 85, etc.), and these individual control systems may be integrated, or otherwise considered to collectively constitute, a single combined controller 27. An exemplary controller 27 includes programmable logic control (PLC) devices having easily used human machine interfaces (HMI), as are known to persons of ordinary skill in the art.

The dispensing apparatus 10 is operative for dispensing pressurized viscous material supplied from a syringe-style supply device 14. Generally, supply device 14 is a disposable syringe or cartridge, and the viscous material filling supply device 14 is any highly-viscous material including, but not limited to, solder flux, solder paste, adhesives, solder mask, thermal compounds, oil, encapsulants, potting compounds, inks, and silicones. The supply device 14 typically includes a wiper or plunger (not shown) movable upon application of air pressure, typically between 5 psi and 30 psi, in the head space above the plunger.

The dispensing apparatus 10, the syringe holder 16, the junction box 18 and the solenoid valve 20 are aligned with a generally planar arrangement to define a reduced overall width profile, when these components are viewed in at least one direction, that increases the overall dispense envelope. Specifically, the total length, L, of the dispensing apparatus 10, including the main body 22, the syringe holder 16, the junction box 18 and the solenoid valve 20, is conventional but the width, W, of dispensing apparatus 10 is significantly reduced as compared with conventional dispensing apparatus. Generally, the width of the dispensing apparatus 10 is about 1.2 inches. Because of the compact width, larger workpieces can be processed by multiple dispensing apparatus 10 arranged in a side-by-side relationship (i.e., the overall dispense area is increased).

Figure 3A:
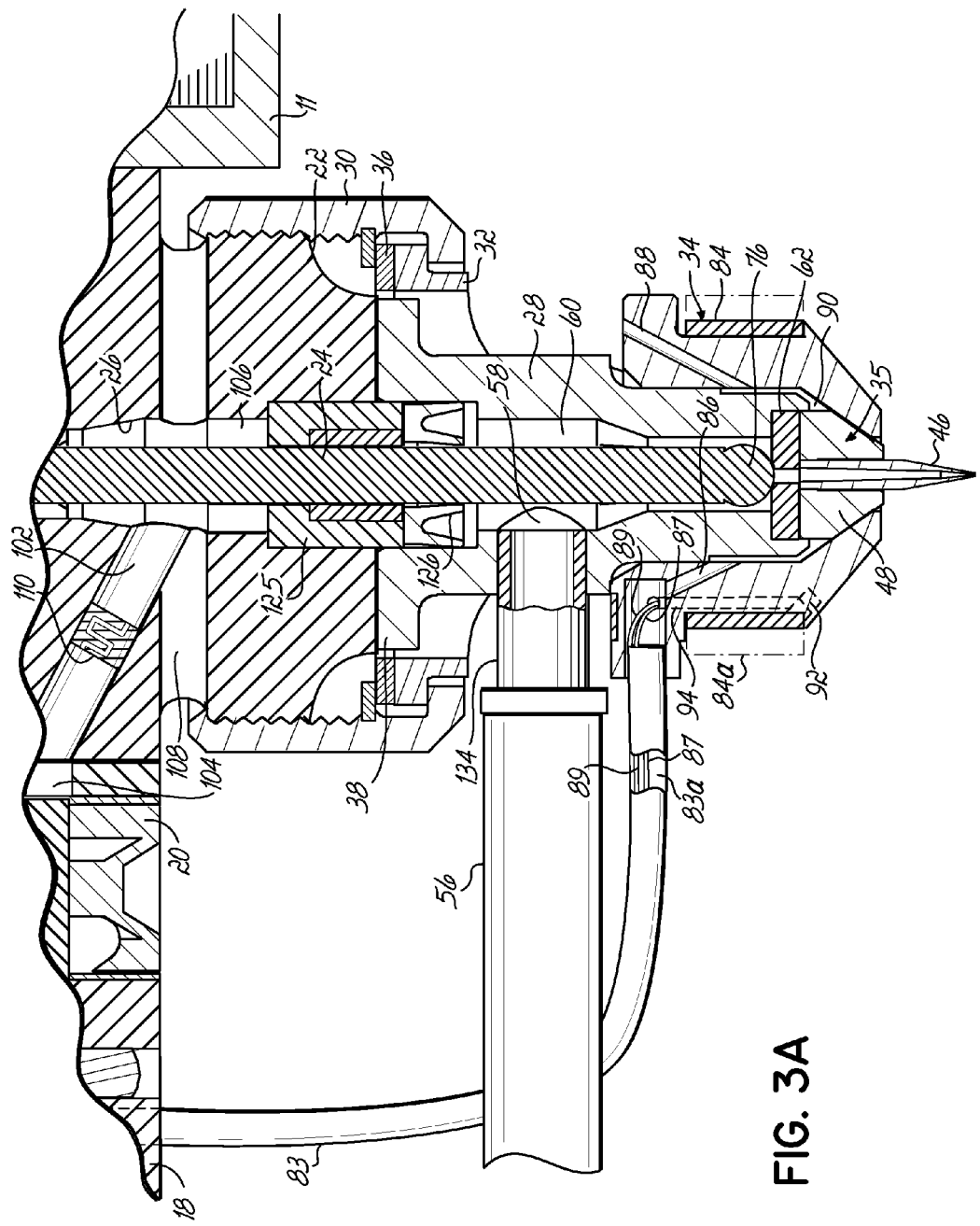
FIG. 3A is an enlarged view of a portion of FIG. 3.

With continued reference to FIGS. 3 and 3A, the dispensing apparatus 10 also includes a valve element, illustrated as a needle 24, axially movable within a longitudinal bore 26 of the main body 22, a fluid chamber housing 28, and a nozzle assembly, generally indicated by reference numeral 34. The nozzle assembly 34 includes a nozzle 35 and a heat transfer member 44 having a slip fit with an exterior portion of the fluid chamber housing 28. A retainer 32, which includes a collar 30 and a wave spring 36 secured to the retainer 32 by a spring clip, removably secures the fluid chamber housing 28 to the main body 22. The heat transfer member 44 participates with the retainer 32 for securing the nozzle 35 and a valve seat disk 62 with the fluid chamber housing 28.

A portion of the collar 30 has a threaded engagement with the main body 22. Extending axially from the retainer 32 is a pair of hooked arms 39*a*, 39*b* (FIG. 1) that engage a rim of heat transfer member 44 for capturing the heat transfer member 44 with the fluid chamber housing 28. Rotation of the retainer 32 relative to the valve body aligns the hooked arms 39*a*, 39*b* with slots in the upper rim of the heat transfer member 44, at which time a downward force can remove the heat transfer member 44 from the fluid chamber housing 28. Nozzle 35 and valve seat disk 62 are then removable tool-free as individual parts, as shown in phantom in FIG. 3. The fluid chamber housing 28 may then be removed from the main body 22 without the assistance of tools. The ease of removing these components reduces the time required for disassembly and reassembly to clean internal wetted surfaces and to perform maintenance. When the valve seat disk 62, the nozzle 35, and optionally the fluid chamber housing 28, are removed from main body 22, the setting of the preloading spring bias applied to needle 24 is preserved so that the setting is reestablished when these components are reassembled.

As an alternative to cleaning the fluid chamber housing 28, an existing fluid chamber housing 28 may be removed from the main body 22 and replaced by a new or cleaned fluid chamber housing 28. In particular, the dispensing apparatus 10 may be provided with a set of fluid chamber housings 28 that are interchangeable and that may be periodically replaced. Removed fluid chamber housings 28 may be cleaned for re-use or, optionally, discarded.

Figure 4:
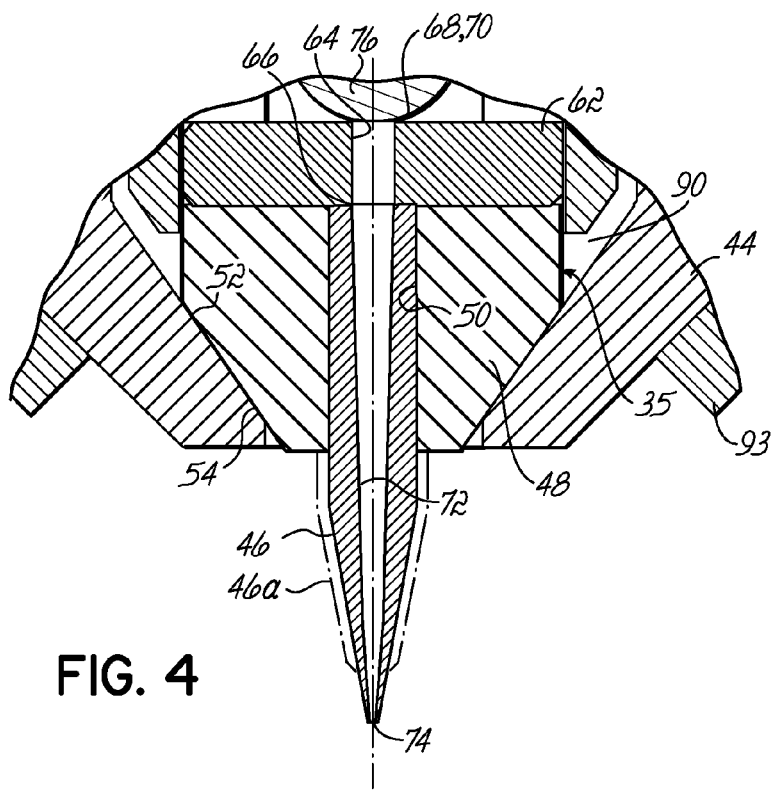
FIG. 4 is an enlarged view of a portion of FIG. 3A.

With reference to FIGS. 3, 3A and 4, the nozzle 35 consists of a nozzle tip 46 joined with a nozzle hub or mount 48. The nozzle tip 46 is inserted into a centered axial bore 50 extending along the axial dimension of the nozzle mount 48 and secured by, for example, epoxy or brazing. A truncated conical or frustoconical surface 54 of the nozzle mount 48 contacts a corresponding truncated conical or frustoconical surface 52 of the heat transfer member 44 when the heat transfer member 44 is installed on the fluid chamber housing 28 and tightened. Frustoconical surface 52 transfers an axial load to the frustoconical surface 54 that secures the nozzle 35 to the fluid chamber housing 28 in a fluid-tight relationship. In one embodiment of the invention, the frustoconical surfaces 52, 54 are each tapered with an included angle of about 70°.

The interface between the frustoconical surfaces 52, 54 promotes efficient heat transfer from the heat transfer member 44 to the nozzle 35 by increasing the surface area over which contact exists between the heat transfer member 44 and the nozzle mount 48. Consequently, the frustoconical interface improves the heat transfer efficiency from the heating element 84 to viscous material flowing inside liquid passageway 72 in the nozzle 35. In addition, the engagement between the frustoconical surfaces 52, 54 operates to self-center the heat transfer member 44 relative to the nozzle mount 48 during installation.

A fluid tube 56 of a conventional construction couples an outlet port of the supply device 14 with an inlet port 58 of a fluid chamber 60 defined inside the fluid chamber housing 28. Viscous material is supplied under pressure from the supply device 14 through fluid tube 56 to inlet port 58 and ultimately to fluid chamber 60. Fitting 134 provides an interface between the fluid tube 56 and the inlet port 58.

With continued reference to FIGS. 3, 3A and 4, positioned within the fluid chamber 60 is the valve seat insert or disk 62, which is captured by the axial load applied by the frustoconical surface 52 to the frustoconical surface 54 in a space defined between the nozzle mount 48 and the fluid chamber housing 28. The valve seat disk 62 is removable from the dispensing apparatus 10 by removing the heat transfer member 44 and the nozzle 35 from the fluid chamber housing 28. Removal of the valve seat disk 62 will also provide access to the fluid chamber 60 for cleaning.

The fluid chamber housing 28, nozzle 35, and valve seat disk 62 are modular components bearing surfaces in the dispensing apparatus 10 wetted by the viscous material and that are easily removable for cleaning. As a result, the cleaning process for the dispensing apparatus 10 is simplified and the overall cleaning time is reduced. In certain embodiments, the entire cleaning process, including disassembly and reassembly of fluid chamber housing 28, nozzle 35, and valve seat disk 62, takes about four to five minutes, which is an order of magnitude faster than comparable cleaning processes for conventional dispensing apparatus. Routine cleaning and maintenance are simplified by a dramatic reduction in the number of tools required to disassemble and re-assemble the fluid chamber housing 28, nozzle 35, and valve seat disk 62. The fluid chamber housing 28, nozzle 35, and valve seat disk 62 may be replaced by comparable clean components and then batched cleaned for further reducing the time required to clean these components. In certain embodiments, the fluid chamber 28 may be formed from an inexpensive disposable material to further simplify maintenance as cleaning is avoided.

The valve seat disk 62 comprises a fluid passageway 64 of a suitable diameter extending between an outlet 66 and an inlet 68. In a new condition, the inlet 68 defines and coincides with a valve seat 70. In a used condition in which the material of the valve seat disk 62 surrounding the inlet 68 has been plastically deformed by contact with needle tip 76, the inlet 68 and valve seat 70 may differ in location, as described herein. In an alternative embodiment of the invention, the valve seat disk 62 may be integral with the nozzle mount 48 of the nozzle 35 and, therefore, removable from the dispensing apparatus 10 as a unit or single piece with the nozzle mount 48.

The nozzle tip 46 is tubular and surrounds a discharge passageway 72 that is coaxial with the outlet 66 from the fluid passageway 64 in the valve seat disk 62. Discharge passageway 72 has a relatively high aspect ratio, which is determined by the ratio of the length of passageway 72 to the diameter of a discharge outlet or orifice 74, so that the nozzle tip 46 is lengthy and narrow as compared with conventional nozzle tips. Preferably, ratio of the length of the discharge passageway 72 to the diameter of discharge orifice 74 is greater than or equal to about 25:1. In certain embodiments of the invention, the diameter of discharge orifice 74 may be one (1) mil to eight (8) mils and the length of nozzle tip 46 may be 0.375 of an inch.

This relatively large aspect ratio permits the nozzle tip 46 to access crowded dispense areas on a workpiece previously inaccessible to conventional dispensing apparatus due to contact between the nozzle tip 46 or another portion of the dispensing apparatus and the workpiece to which the viscous material is being applied. Specifically, the large aspect ratio of the permits the nozzle tip 46 to protrude from the nozzle mount 48, as compared with conventional dispensing nozzles. Increasing the aspect ratio increases the length of nozzle tip 46 that may protrude from the nozzle mount 48. The nozzle tip 46 may be formed from any suitable material including but not limited to tungsten and ceramics that are resistant to damage if contacted by an object in the environment surrounding the dispensing apparatus 10. The nozzle tip 46 may also include a layer 46a of thermally insulating material, such as a coating, that reduces heat loss from the nozzle tip 46. The insulation provided by layer 46a would serve to stabilize the temperature of the viscous material resident in discharge passageway 72. The high aspect ratio of the nozzle tip 46 provides sufficient space for providing the layer 46a without otherwise interfering with dispensing operations.

The discharge passageway 72 is tapered (or narrowed) along its length in a direction extending toward the discharge orifice 74 from which the viscous material is discharged so that the diameter is narrowest proximate to the orifice 74. Tapering the discharge passageway 72 permits the aspect ratio to be increased without introducing a significant pressure drop over the passageway length and thereby compensates for the non-conventional length of discharge passageway 72 by increasing the velocity of the dispensed viscous material at the discharge orifice 74. The outer diameter of the nozzle tip 46 may be substantially uniform over most of the tip length.

With reference to FIGS. 3, 3A, 4, 5A and 5B, a lower end of the needle 24 includes a needle tip 76 adapted for sealing engagement with valve seat 70 to prevent liquid flow from the fluid chamber 60 into the fluid passageway 64. An end of the needle 24 opposite to the needle tip 76 is secured with a bore in an air piston 78 that is slidably movable within an air cavity 80 formed in the main body 22. An annular seal carried by the air piston 78 provides a fluid-tight sliding seal with a cylindrical surface surrounding the air cavity 80. Pressurized air selectively provided to the air cavity 80, as explained below, provides for controlled, reciprocating movement of needle tip 76 into and out of sealing engagement with valve seat 70. With needle tip 76 positioned in a retracted position away from valve seat 70, an amount of viscous material flows from the fluid chamber 60 through the fluid passageway 64 of valve seat disk 62 and through the discharge passageway 72 of nozzle tip 46. A comparable amount of viscous material separates from the discharge orifice 74 to define a droplet 71 (FIG. 1) because of rapid movement of the needle tip 76 toward and into contact with the valve seat 70. The airborne droplet 71 of viscous material is propelled from the discharge orifice 74 toward, and deposited on, a workpiece (not shown), such as a printed circuit board.

The needle tip 76 is substantially spherical for making a sealing contact with the circular valve seat 70. Typically, the radius of the needle tip 76 is selected according to the dimensions of the valve seat 70 and the fluid passageway 64 in the valve seat disk 62 so that a sealing engagement is provided. As the valve seat 70 wears and/or plastically deforms, the sealing engagement may transform from a line-of-contact to an annular contact surface.

Figure 5A:
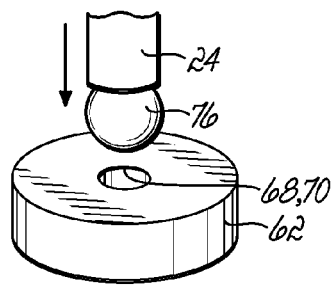
FIG. 5A is a view of a needle tip and a valve seat disk in accordance with an embodiment of the invention.
Figure 5B:
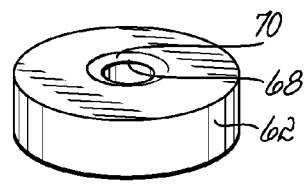
FIG. 5B is a view similar to FIG. 5A, with the needle tip removed for clarity, demonstrating the plastic deformation of the valve seat disk about the valve seat after contact with the needle tip in the closed position.
Figure 6:
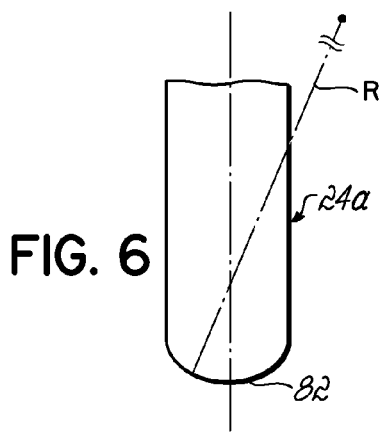
FIG. 6 is a side view of an alternative embodiment of a needle tip for use in the dispensing apparatus of FIG. 1.

With reference to FIG. 6 and in accordance with an alternative embodiment of the invention, the dispensing apparatus 10 may be provided with a needle 24a having a needle tip 82 characterized by a convex curvature capable of forming an effective sealing engagement with multiple different valve seat disks 62 among which the inlet 68 and valve seat 70 differs in diameter. In one specific embodiment, the needle tip 82 may have a radius of curvature of about one (1) inch, which effectively seals valve seats 70 on valve disks 62 with discharge passages 64 ranging from 0.010" to 0.060" in diameter. This advantageously provides the ability to change the size of the dispensed droplet over a greater range without also changing the needle 24a, which improves the flexibility and range of the dispensing apparatus 10. Additionally, the relatively large radius of curvature of needle tip 82 has been sized to tolerate off-axis misalignment between needle tip 82 and valve seat 70.

With reference to FIGS. 3A, 4, 5A and 5B, the valve seat disk 62, or at least a central portion of the valve seat disk 62 including the valve seat 70, is formed from a material, such as 440C stainless steel or 303 stainless steel, that is softer than the material forming the needle tip 76. As a result, the valve seat 70 wears faster than the needle tip 76 and the operating lifetime of the needle 24 is increased. An unused valve seat disk 62 includes a circular valve seat 70 coincident with inlet 68, as shown in FIG. 5A. When the needle tip 76 repeatedly strikes the valve seat 70 in the closed position during the initial dispensing cycles, the valve seat 70 deforms plastically to correlate or conform with the shape of the needle tip 76, as shown in FIG. 5B. The plastic deformation or coining defines an annular surface of contact between the valve seat 70 and needle tip 76 and eliminates the need to match lap the needle tip 76 and valve seat 70. The valve seat 70 does not coincide with the inlet 68 after the plastic deformation occurs, although the invention is not so limited. The valve seat disk 62 is interchangeable and replaceable without the need to also replace the needle 24. The conforming nature of the valve seat disk 62 eliminates the need to simultaneously lap the valve seat 70 of valve seat disk 62 and the needle tip 76 to form a matched pair, as is true in conventional dispensing apparatus.

If the valve seat 70 is damaged or worn out or to simply change the diameter of the fluid passageway 64, a new valve seat disk 62 may be installed without also installing a new needle 24. The needle tip 76 of the existing needle 24 will deform the valve seat 70 of the replacement valve seat disk 62 to establish a sealing engagement therebetween and effectively preserve the axial alignment therewith despite the exchange. Misalignments radial or transverse to the longitudinal axis of needle 24 in the lateral location of the needle tip 76 in relation to the valve seat 70 are accommodated by the deformation of the valve seat 70.

With reference to FIGS. 3 and 3A, a heating element 84, which may be a flexible thermal foil resistance heater, surrounds the exterior of the heat transfer member 44. The heating element 84 has an efficient heat transfer or thermal contact relationship with the heat transfer member 44 for heating the heat transfer member 44. Heat is readily transferred from the heat transfer member 44 to the nozzle mount 48 for locally heating the nozzle tip 46 and the viscous material resident in the discharge passageway 72. In certain embodiments of the invention, the exterior of the heating element 84 and/or the heat transfer member 44 may be covered by a layer of thermal insulation 84a that limits heat loss from heating element 84, which aids in temperature control.

Heat transfer member 44 further incorporates an inlet passageway 86, an outlet passageway 88, and an annular plenum 90 (FIG. 3A) coupling the inlet and outlet passageways 86, 88 and surrounding an axial length of the nozzle mount 48. A coolant gas, such as air, is supplied to inlet passageway 86 from a coolant fluid supply 85 via air conduits 25 and 83, which are coupled inside the junction box 18. The coolant gas flows from the inlet passageway 86 through the annular plenum 90 and is exhausted through the outlet passageway 88 to create a positive fluid flow. The dimensions of the inlet and outlet passageways 86, 88 and the annular plenum 90 are preferably chosen to optimize heat transfer to the flowing coolant gas. The invention contemplates that the coolant gas may be provided in a different manner or cooling may be accomplished using a different cooling fluid, such as a liquid. In an alternative embodiment of the invention, the heat transfer body 44 may be cooled using a thermoelectric cooling device 93 (FIG. 4A), such as a Peltier cooler.

A temperature sensor 92 (FIG. 3A), such as a resistance temperature detector, is disposed in a blind sensor passageway 94 (FIG. 3A) defined in the heat transfer member 44. The temperature sensor 92, which is positioned in heat transfer member 44 proximate to the heating element 84, provides a temperature feedback signal over a set of leads 87, 89 to controller 27. Leads 87, 89 emerge from the open end of a lumen 83a of air conduit 83 from the junction box 18, and couple with the temperature sensor 92. Inside the junction box 18, the leads 87, 89 are split from the air conduit 83 and coupled by a connector 95 with electrical cable 21. More specifically, the leads 87, 89 exit from one arm of a tee 91 that is otherwise sealed to prevent coolant air leakage.

Controller 27 (FIG. 3) operates the heating element 84 and also regulates the flow of coolant gas from the coolant fluid supply 85 to the inlet coolant passageway 86 in order to maintain the nozzle tip 46 and the viscous material resident in passageways 64 and 72 at a targeted temperature, as represented by a temperature set point. When the temperature is less than the set point, heat is supplied from the heating element 84 to the heat transfer member 44 and subsequently conducted to the nozzle 35 and to viscous material inside nozzle tip 46. When the temperature exceeds the set point, the heat transfer member 44 is actively cooled by a flow of coolant gas through the annular plenum 90, which subsequently cools the nozzle 35 and viscous material inside nozzle tip 46. In certain embodiments, the controller 27 automatically switches between heating and cooling for precision temperature regulation of the viscous material inside passageways 64 and 72 without manual intervention and using only feedback temperature information supplied by temperature sensor 92. The invention contemplates that the active cooling, which is illustrated as an air flow through passageways 83a and 86 and plenum 90, may be any cooling mechanism that reduces the temperature of the heat transfer member 44 and/or nozzle 35 by removing heat from these structures.

The precise heating and active cooling of nozzle 35 and, in particular, nozzle tip 46 minimizes viscosity variations of the viscous material residing in passageways 64 and 72 for purposes of flowability and dispensing precise and reproducible amounts of viscous materials. However, the nozzle tip 46 is maintained below a temperature that may degrade the properties of the viscous material, such as prematurely causing either gelling or curing. Typically, the dispensability of the viscous material residing in the nozzle tip 46 is improved by maintaining its temperature in a range between about 30° C. to about 65° C., although the temperature range is not so limited and may depend upon the identity of the viscous material. The viscous material should be maintained at the selected temperature range for only a brief period of time and not to exceed a temperature at which curing may occur. For this reason, only the nozzle assembly 34 is held at the temperature set point and not the remainder of dispensing apparatus 10.

With reference to FIGS. 1-3, 3A, and 7, the solenoid valve 20 is mounted directly against the main body 22 with an intervening thermal barrier 96 that prevents or, at the least, reduces heat transfer from the solenoid valve 20 to the main body 22. Direct attachment of the solenoid valve 20 to the main body 22 reduces the air volume thereby promoting a rapid air pressure change to actuate the air piston 78, which decreases the response time for filling the air cavity 80 to open and close the dispensing apparatus 10. Solenoid valve 20 typically includes a movable spool actuated by selectively energizing and de-energizing an electromagnetic coil (not shown) with an electrical signal from a driver circuit 20a. The driver circuit 20a is of a known design with a power switching circuit providing electrical signals to the solenoid valve 20. The driver circuit 20a may be incorporated into the construction of the solenoid valve 20.

In response to an electrical signal from the driver circuit 20a, the solenoid valve 20 selectively switches a flow path for pressurized air to an air supply port 101 between an air inlet port 99 and an air exhaust port 100. The supply port 101 communicates with air cavity 80 through a passageway 98 defined in the main body 22. When a suitable electrical signal is applied to solenoid valve 20, pressurized air is supplied from air inlet port 99 to supply port 101 and, subsequently, to passageway 98. A fluid path to exhaust port 100 is blocked inside the solenoid valve 20. When the electrical signal is discontinued, air inlet port 99 is blocked and exhaust port 100 is coupled with supply port 101. Pressurized air filling air cavity 80 is serially exhausted through passageway 98, supply port 101 and exhaust port 100.

The solenoid valve 20 may be any three-way or four-way valve that operates to switch a flow of pressurized air among flow paths as understood by those of ordinary skill in the art. A product line of three-way solenoid valves suitable for use as solenoid valve 20 in dispensing apparatus 10 is the MHA2 product line of solenoid valves, commercially available from Festo Corporation of Hauppauge, N.Y.

Figure 7:
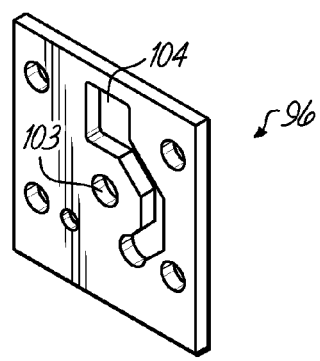
FIG. 7 is a perspective view of an embodiment of a thermal barrier separating and thermally isolating the solenoid valve from the main body.

With reference to FIGS. 3, 3A, and 7, air piston 78 defines an axially-movable confinement wall of air cavity 80 and is pneumatically sealed with the sidewall of air cavity 80. When the solenoid valve 20 is switched by the electrical signal to fill the air cavity 80 with pressurized air through passageway 98, the air piston 78 and needle 24 move axially in a direction that separates the needle tip 76 from the valve seat 70 and thereby provides the opened position. Conversely, when the solenoid valve 20 is switched to exhaust the air cavity 80 of pressurized air by removing the electrical signal, the air piston 78 and needle 24 move axially in a direction that contacts the needle tip 76 with the valve seat 70 and thereby provides the closed position.

The exhaust port 100 of the solenoid valve 20 is fluidically coupled with an air passageway 102 in the main body 22 by a slotted channel 104 formed in the thermal barrier 96. An opening 103 is also provided in thermal barrier 96 for coupling supply port 101 with passageway 98. The pressurized air exhausted from the air cavity 80 is cooled by rapid decompression of the air cavity 80 as the dispensing apparatus 10 closes and movement of air piston 78 toward its closed position. This cooled exhaust air from air cavity 80 is directed by the channel 104 between its opposite closed ends from the exhaust port 100 to the air passageway 102 and subsequently to an air plenum 106 surrounding a length of the needle 24. The exhaust air is ultimately routed to the ambient environment of dispensing apparatus 10 through an outlet passageway 108 cross-drilled through main body 22, which has been rotated from its actual angular orientation for clarity. The flow of cool exhaust air removes heat from the needle 24 and main body 22. The heat is dumped into the ambient environment of dispensing apparatus 10 for disposal. The flow of cool exhaust air participates in precision regulation of the temperature of the nozzle tip 46 by reducing conductive heat flow from the main body 22 and the needle 24 to the fluid chamber housing 28 and nozzle 35. This prevents or reduces the incidence of premature gelling and/or curing inside the main body 22. The channel 104 in the thermal barrier 96 and air passageway 102 in the main body 22 cooperate to further reduce noise produced by the exhausted pressurized air by altering the direction of the airflow.

The thermal barrier 96 and the active air flow of the cooled exhaust air through the passageways 102 and 108 and plenum 106 in the main body 22, considered either individually or collectively, assist in thermal management of the heat load within the main body 22. As a result, extraneous heat sources do not influence or, at the least have a minimal influence on, the temperature of the nozzle 35 and the viscous material resident therein during a dispensing cycle.

The solenoid valve 20 may be overdriven by the driver circuit 20a energizing the electromagnetic coil (not shown) of the solenoid valve 20 in order to increase the operating speed of dispensing apparatus 10 by causing faster acceleration of the air piston 78 from a stationary state. The total response time for opening the dispensing apparatus 10 is measured from the moment that an electrical signal is initially provided to the solenoid valve 20 until the instant that the dispensing apparatus 10 is fully open. The total response time consists of a contribution from the solenoid response time required for the solenoid valve 20 to switch and supply pressurized air at full flow to the passageway 98 and a contribution from the fill time required to fill the air cavity 80 with pressurized air that terminates when the needle 24 is in a fully open position. The solenoid response time is reduced by causing the driver circuit 20a to place an overdriving voltage on the electromagnetic coil during switching beyond a rated voltage for the solenoid valve 20, which decreases the total valve response time. For example, a solenoid valve 20 rated for five (5) VDC may be energized with a voltage of twenty-four (24) VDC by the drive circuit 20a to decrease response time and then modulated to maintain the solenoid valve 20 in an opened state without damaging the solenoid valve 20. In conjunction with the close coupling of the solenoid valve 20 to the main body 22, the overdriving of the driver circuit 20a permits the air cavity 80 to be filled and the needle 24 to be placed in an opened condition, including electrical response time of the solenoid valve 20, in less than four (4) milliseconds. The overdriving of the solenoid valve 20 thereby reduces the total response time for opening the dispensing apparatus 10 by reducing the time contribution due to the solenoid response relative to the time required to fill the air cavity 80. The air cavity 80 is typically exhausted of air pressure and the needle 24 moved to a closed condition in three (3) to four (4) milliseconds. This results in a maximum operating frequency of about 200 Hz, as a portion of the time required to close the dispensing apparatus 10 may overlap with the time required to open the dispensing apparatus 10.

With reference to FIGS. 3 and 3A, a sonic muffler 110 may be provided in the air passageway 102 in main body 22 for attenuating the sound waves associated with the exhausted air, which significantly reduces the noise related to air exhaust from air cavity 80 without significantly retarding the closing response time of the air piston 78. The sonic muffler 110 may be a porous structure formed, for example, from steel wool, polyethylene, or a metal such as bronze, steel, or aluminum, or may constitute a baffle with internal passageways that slow airflow by deflecting, checking, or otherwise regulating air flow in the air passageway 102. The backpressure created by the sonic muffler 110 does not effect the response time for closing the dispensing apparatus 10 at the associated air pressure within the air cavity 80. Because the exhaust port 100 of the solenoid valve 20 is fluidically coupled with air passageway 102 in the main body 22, a conventional muffler cannot be attached to the exhaust port 100.

A stroke adjust assembly includes a sleeve 116, a load screw 112 threadingly engaged with sleeve 116, and a compression spring 114 compressed by the load screw 112 for applying an axial load to a load button 115 proximate to an end of the needle 24 opposite to the needle tip 76. The load screw 112 is, which is secured to the main body 22 through sleeve 116, and is movable axially by rotation relative to main body 22. The compression spring 114 is partially compressed and thereby preloaded by adjustment of the axial position of the load screw 112 relative to the sleeve 116. After this preloaded spring bias is set, a treadlocker is applied to permanently fix the relative positions of the load screw 112 and sleeve 116.

A stroke adjust knob 118 is affixed to the load screw 112 and, thereafter, is used to rotate load screw 112 and sleeve 116 relative to the main body 22 for defining a stroke length for the needle tip 76 relative to the valve seat 70. The dispensing apparatus 10 is depicted in FIG. 3 with a zero stroke length setting and the maximum preload spring bias. Setting the stroke length modifies the magnitude of the preloaded spring bias.

When sufficient pressurized air is supplied to air cavity 80 for overcoming the preloaded spring bias, air piston 78 will carry needle 24 and the load button 115 in a direction away from valve seat 70. Contact between load button 115 and sleeve 116 operates as a stop. As a result, the needle tip 76 separates from the valve seat 70 and a small amount of viscous material flows into fluid passageway 64 in the valve seat disk 62. When air pressure is exhausted from air cavity 80, the axial load from spring 114 rapidly moves the needle 24 toward the valve seat 70, which forces a small amount of viscous material resident in passageway 72 out of discharge orifice 74.

The preloading spring bias, as modified by the stroke adjust setting, is conserved when heat transfer member 44, the nozzle 35, and/or the fluid chamber housing 28 are removed from dispensing apparatus 10 and replaced, such as during cleaning and maintenance. As a result, the preloading spring bias will not normally need to be readjusted from the value set at the time of manufacture and/or before the dispensing apparatus 10 is placed into operation. The ability to preserve the preloading spring bias of spring 114 eases re-assembly and installation.

The needle 24 is guided during its reciprocating axial movement within the main body 22 by a pair of axially spaced needle guides or bushings 122, 124, of which bushing 124 is positioned in a bearing sleeve 125. Bushings 122, 124 may be formed from plastic, such as PEEK containing graphite that operates as a lubricant. The axial spacing of the bushings 122, 124 is selected to be at least four (4) times the diameter of the portion of the needle 24 therein, which advantageously provides and maintains accurate axial guidance of the needle tip 76 for repeated contact and sealing with the valve seat 70 over multiple dispensing cycles. A fluid seal 126 surrounding a portion of the needle 24 and a fluid seal 128 surrounding a different portion of the needle 24 isolate the fluid chamber 60 and the air cavity 80, respectively, from the portion of bore 26 between bushings 122, 124.

Figure 8:
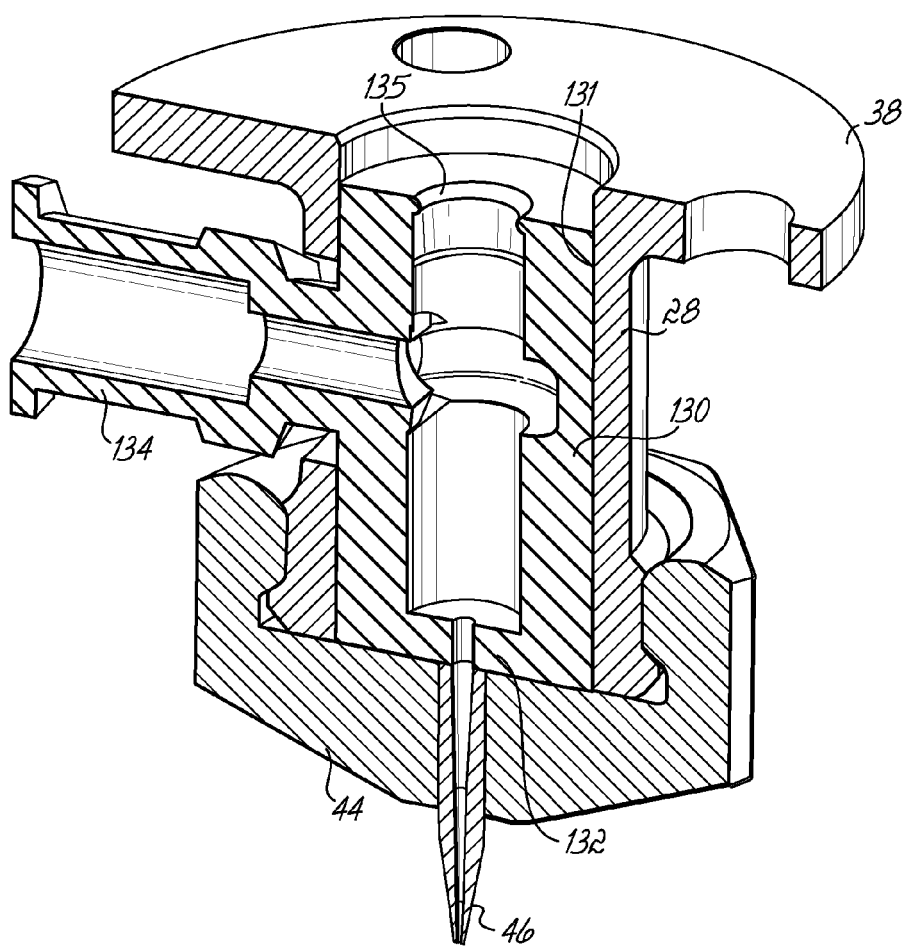
FIG. 8 is a partial cross-sectional view of an alternative embodiment of a fluid chamber housing for use with the dispensing apparatus of FIG. 1.

With reference to FIG. 8 in which like reference numerals refer to like features in FIGS. 1-7 and in accordance with an alternative embodiment of the invention, a liner 130 may be positioned inside of the fluid chamber housing 28. Liner 130 acts as a fluid barrier that prevents wetting of the interior surfaces 131 of the fluid chamber housing 28. The liner 130 is removable from the fluid chamber housing 28 and, hence, replaceable. Therefore, these interior surfaces 131 do not have to be cleaned when the fluid chamber housing 28 is removed from the main body 22 and is readily reusable by simply inserting a fresh or clean liner 130.

Liner 130 may be formed from any suitable material including, but not limited to, aluminum and polymers like nylon. The liner 130 may be cleaned and reused, or may simply be discarded if formed from a relatively inexpensive material. The liner 130 is illustrated as including an integral valve seat disk 132, fluid fitting 134, and a fluid seal 135 which are removable along with the liner 130, although the invention is not so limited.

Figure 9A:
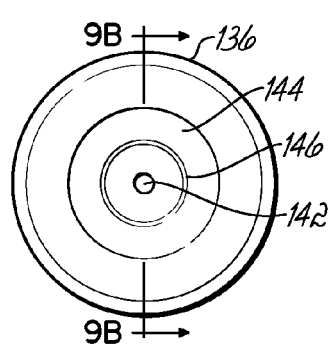
FIGS. 9A and 9B are top and cross-sectional views of an alternative embodiment of a valve seat disk for use in the dispensing apparatus.
Figure 9B:
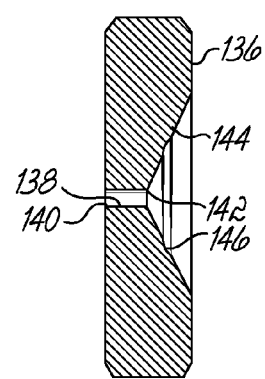

With reference to FIGS. 9A and 9B in which like reference numerals refer to like features in FIGS. 1-7 and in accordance with an alternative embodiment of the invention, a valve seat disk 136 similar to valve seat disk 62 (FIGS. 5A and 5B) and suitable for use with dispensing apparatus 10 (FIG. 1) includes a discharge passageway 138 having an outlet 140 and an inlet 142. In the closed position, the needle tip 76 (FIG. 5A) contacts a frustoconical surface 144 across a valve seat 146 that is spaced from inlet 142. The geometrical shape of the valve seat 146 may be defined by plastic deformation or coining due to repeated contact between the needle tip 76 and the frustoconical surface 144. The valve seat 146 may widen during operation of the dispensing apparatus 10 (FIG. 1) due to gradual wear of the frustoconical surface 144 by the reciprocating action of the needle tip 76 relative to the valve seat 146 and the presence of abrasives in the viscous material being dispensed. Because the valve seat 146 is spaced from the inlet 142, geometrical changes in the valve seat 146 due to contact by needle tip 76 do not significantly impact the inlet 142. The valve seat disk 136 may be formed from the same material as valve seat disk 62 or, alternatively, valve seat disk 136, or at least the frustoconical surface 144, may be coated with a substance in this hardness range. This may be beneficial when dispensing viscous materials that are abrasive, as the wear of frustoconical surface 144 will be reduced.

The portion of the frustoconical surface 144 defining valve seat 146 may be plastically deformed to define the initial valve seat 146, before valve seat disk 136 is installed in the dispensing apparatus 10 and contacted by the needle tip 76 in the closed position. This pre-use dimpling increases the area of the valve seat 146 contacted by needle tip 76. The rate of the initial wear of a non-dimpled valve seat, if allowed to occur in the dispensing apparatus 10, is significantly greater than the subsequent wear rate. Pre-use dimpling of frustoconical surface 144 to define the initial valve seat 146 operates to flatten the wear curve so that the higher initial wear is not experienced when the valve seat disk 136 is initially installed in the dispensing apparatus 10. Pre-use dimpling permits the liquid dispenser 10 to operate in the lower linear regime immediately upon installation without experience the initial higher and/or non-linear wear rate.

Figure 10:
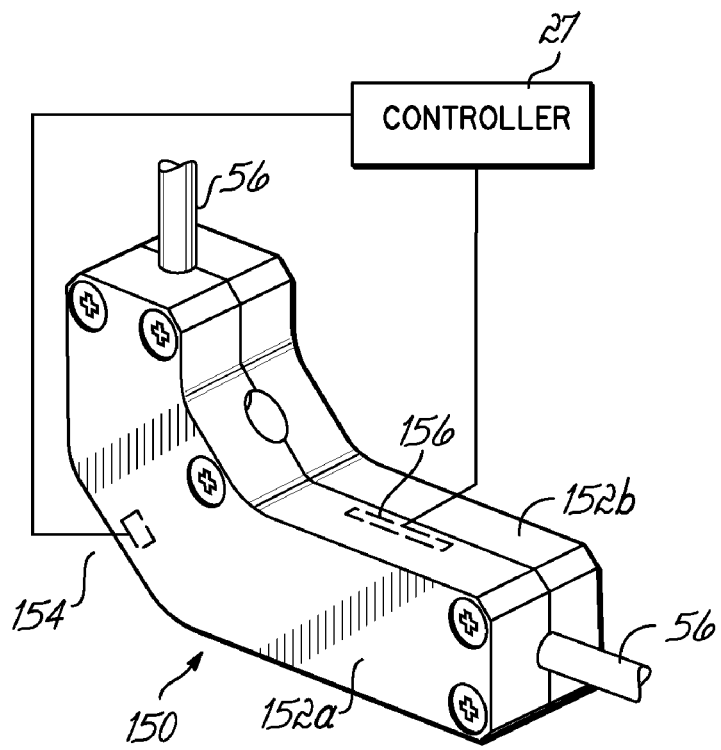
FIG. 10 is a perspective view of a fluid tube heater in accordance with an embodiment of the invention.

With reference to FIG. 10 and in accordance with an alternative embodiment of the invention, a heater 150 may be positioned about a length of the fluid tube 56 for applying heat to elevate the temperature of the viscous material being transferred through tube 56 to the main body 22 (FIG. 3). The heater 150 includes a thermally-conductive block or body 152 that mounts onto the fluid tube 56 with a good thermal contact. Positioned in thermal contact with the body 152 and within corresponding blind bores are a heating element 154 and a temperature sensor 156. Electrical leads extend from the heating element 154 and the temperature sensor 156 to controller 27. The body 152 may have a clamshell-style construction with a groove formed in each shell half 152a, 152b into which the fluid tube 56 is received with a contact effective for heat transfer. The heat supplied by heater 150 to the viscous material in side fluid tube 56 supplements the heating of the viscous material in the nozzle 35 (FIG. 3A) and may be particularly useful for dispensing at high flow rates in which the flow of viscous material through the discharge passageway 72 (FIG. 4) is too fast for effective temperature control by heat transfer within nozzle 35 alone.

Figure 11:
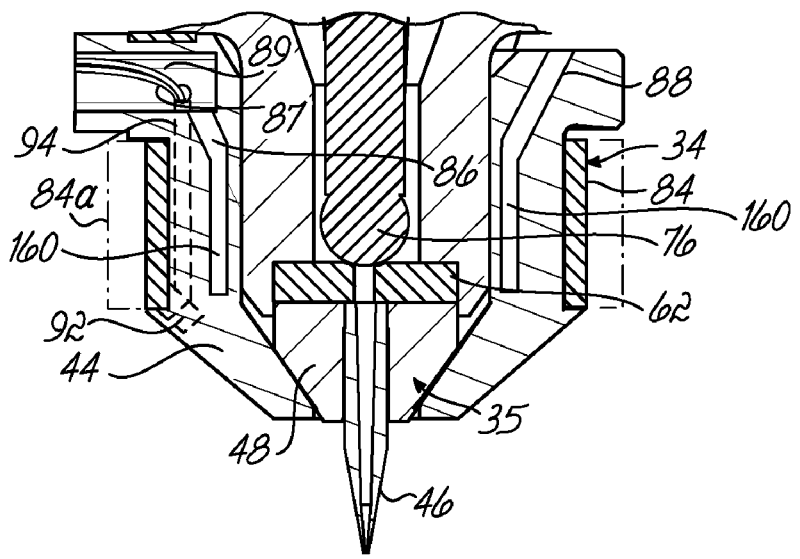
FIG. 11 is a cross-sectional view similar to FIG. 3A in accordance with an alternative embodiment of the invention.

With reference to FIG. 11 in which like reference numerals refer to like features in FIG. 3A and in accordance with alternative embodiment of the invention, heat transfer member 44 may include an annular internal plenum 160 coupling the inlet and outlet passageways 86, 88. The plenum 160 extends circumferentially about the heat transfer member 44 and, as a result, encircles or surrounds an axial length of the nozzle mount 48. Coolant gas supplied from air conduit 83 to inlet passageway 86 flows through plenum 160 and is exhausted through the outlet passageway 88 to create a positive fluid flow. The internal plenum 160 may be implemented either individually or in combination with plenum 90 (FIG. 3A).

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicants' general inventive concept. The scope of the invention itself should only be defined by the appended claims, wherein we claim:

The invention claimed is:

1. An apparatus for dispensing a viscous fluid in a noncontact manner, comprising:
   a supply of viscous material;
   a coolant fluid source capable of supplying a coolant fluid;
   a nozzle assembly including a discharge passageway, a heat transfer member, a temperature sensor thermally coupled with said heat transfer member, a first fluid passageway in said heat transfer member and coupled in fluid communication with said coolant fluid source to direct a flow of the coolant fluid to said first fluid passageway, a plenum connected in fluid communication with said first fluid passageway for receiving the flow of the coolant fluid, and a second fluid passageway in said heat transfer member and coupled in fluid communication with said plenum for exhausting the flow of the coolant fluid from said plenum, the plenum extending at least partially around said nozzle assembly;
   a fluid chamber housing, said fluid chamber housing including a fluid chamber, said fluid chamber being in fluid communication with said discharge passageway and said supply of viscous material;
   a main body containing a part of a valve element, a part of said valve element extending through said fluid chamber, said valve element having an opened position in which the viscous material is allowed to flow from said fluid chamber into said discharge passageway and a closed position in which the viscous material is blocked from flowing from said fluid chamber into said discharge passageway; and
   a controller electrically coupled with said temperature sensor and with said coolant fluid source, said controller causing said coolant fluid source to supply the coolant fluid to said heat transfer member and thereby cool at least a part of said nozzle assembly in response to temperature signals received from said temperature sensor.

2. The apparatus of claim 1 wherein said nozzle assembly further comprises:
   a heating element operatively coupled with said controller and thermally coupled with said heat transfer member, said controller causing said heating element to heat said heat transfer member and at least a part of said nozzle assembly in response to temperature signals received from said temperature sensor.

3. The apparatus of claim 2 wherein the apparatus is configured to jet a droplet of the viscous material from said discharge passageway as the valve element is moved from the opened to the closed position.

4. The apparatus of claim 2, wherein said main body includes an air cavity, and said valve element is movable between the opened and closed positions by selective application of pressurized air to said air cavity, and further comprising:
   a solenoid valve having an exhaust port selectively coupled in fluid communication with said air cavity, said solenoid valve configured to direct the pressurized air from said air cavity to said exhaust port to permit movement of said valve element from said opened to said closed position; and
   an air passageway extending through said main body, said air passageway coupled by said exhaust port of said solenoid valve with said air cavity of said main body so that pressurized air exhausted from said air cavity flows through said air passageway to cool said main body.

5. The apparatus of claim 4, wherein said apparatus is configured to jet a droplet of the viscous material from said discharge passageway as said valve element is moved from the opened position to the closed position.

6. The apparatus of claim 1 wherein said main body includes an air cavity, and said valve element is movable between the opened and closed positions by selective application of pressurized air to said air cavity, and further comprising:
   a solenoid valve having an exhaust port selectively coupled in fluid communication with said air cavity, said solenoid valve configured to direct the pressurized air from said air cavity to said exhaust port to permit movement of said valve element from said opened condition to said closed position; and
   an air passageway extending through said main body, said air passageway coupled by said exhaust port of said solenoid valve with said air cavity of said main body so that pressurized air exhausted from said air cavity flows through said air passageway to cool said main body.

7. The apparatus of claim 6, wherein said apparatus is configured to jet a droplet of the viscous material from said discharge passageway as said valve element is moved from the opened to the closed position.

8. The apparatus of claim 1 wherein said fluid chamber housing is attached to said main body.

9. The apparatus of claim 8 wherein said nozzle assembly is releasably attached to said fluid chamber housing.

10. The apparatus of claim 8 wherein said fluid chamber housing is releasably attached to said main body.

11. The apparatus of claim 1 wherein said plenum is annular.

* * * * *